United States Patent
Sekita et al.

(10) Patent No.: US 10,212,369 B2
(45) Date of Patent: Feb. 19, 2019

(54) SOLID-STATE IMAGING APPARATUS AND ELECTRONIC DEVICE

(71) Applicant: SEIKO EPSON CORPORATION, Tokyo (JP)

(72) Inventors: Shinichi Sekita, Suwa (JP); Naoki Nomura, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/866,987

(22) Filed: Jan. 10, 2018

(65) Prior Publication Data

US 2018/0213165 A1  Jul. 26, 2018

(30) Foreign Application Priority Data

Jan. 25, 2017 (JP) ................. 2017-010804

(51) Int. Cl.
| | |
|---|---|
| *H03M 1/00* | (2006.01) |
| *H03M 1/12* | (2006.01) |
| *H04N 5/378* | (2011.01) |
| *H04N 5/345* | (2011.01) |
| *H04N 5/372* | (2011.01) |
| *H01L 27/146* | (2006.01) |

(52) U.S. Cl.
CPC ..... *H04N 5/3452* (2013.01); *H01L 27/14609* (2013.01); *H04N 5/372* (2013.01); *H04N 5/378* (2013.01)

(58) Field of Classification Search
CPC .. H03M 1/50–1/58; H03M 1/00–1/645; H04N 5/3355; H04N 5/3745; H04N 5/37455; H04N 5/378
See application file for complete search history.

(56) References Cited

U.S. PATENT DOCUMENTS

| | | | |
|---|---|---|---|
| 2012/0182450 A1 | 7/2012 | Sato et al. | |
| 2013/0229560 A1* | 9/2013 | Kondo | H04N 5/374 348/308 |

FOREIGN PATENT DOCUMENTS

JP  2012-151664 A  8/2012

* cited by examiner

*Primary Examiner* — Sinh Tran
*Assistant Examiner* — Selam T Gebriel
(74) *Attorney, Agent, or Firm* — Oliff PLC

(57) ABSTRACT

The present solid-state imaging apparatus includes: a light receiving element with a photoelectric conversion function; a readout circuit that reads out pixel information from the light receiving element, and outputs an output voltage; a CDS circuit that is composed of three-stage common source circuits, and generates a pixel signal based on a difference between an output voltage output from the readout circuit at the time of reset and an output voltage output based on the readout of the pixel information, the three-stage common source circuits being connected in series to one another and provided with direct-current cut elements that are each disposed on a corresponding one of input paths of the three-stage common source circuits; and a bias voltage supply circuit that supplies a direct-current bias voltage to gates of transistors of the three-stage common source circuits.

9 Claims, 8 Drawing Sheets

SOLID-STATE IMAGING APPARATUS AND ELECTRONIC DEVICE

BACKGROUND

1. Technical Field

The present invention relates to a solid-state imaging apparatus, as well as an electronic device and the like that use the solid-state imaging apparatus.

2. Related Art

In a solid-state imaging apparatus such as a contact image sensor, light receiving elements that are each arranged in a different one of pixels in a pixel unit perform photoelectric conversion in accordance with illuminance, and a readout circuit reads out image information from the light receiving elements. An output voltage of the readout circuit is supplied to a CDS (correlated double sampling) circuit so as to cancel out variations in an offset voltage between the plurality of pixels. The CDS circuit generates a pixel signal based on a difference between an output voltage output from the readout circuit at the time of reset and an output voltage output based on the readout of pixel information.

As related art, published U.S. Patent Application No. 2012/0182450 discloses a solid-state imaging apparatus that is intended to improve the precision of temperature measurement based on the current-voltage characteristics of a diode. This solid-state imaging apparatus includes a pixel array unit, an image CDS processor, a temperature sensor, a temperature CDS processor, and a timing generator. As shown in FIG. 5 of published U.S. Patent Application No. 2012/0182450, the image CDS processor includes the following elements on a per-column basis: a capacitor C1, a comparator (operational amplifier) PA, a switch transistor Tcp, an inverter V, and an up/down counter UD.

Solid-state imaging apparatuses are expected to improve the linearity of a signal voltage relative to a change in illuminance, downsize the circuits, and reduce current consumption. However, a CDS circuit composed of operational amplifiers, like the solid-state imaging apparatus of published U.S. Patent Application No. 2012/0182450, has significant disadvantages including an increased circuit area and increased current consumption. There is also the problem of difficulty in detecting a defective portion when the CDS circuit is determined to be defective in an operation test.

SUMMARY

A first advantage of some aspects of the invention is to provide a solid-state imaging apparatus including a CDS circuit that allows for easy detection of a defective portion without making the circuit area and the current consumption very large. A second advantage of some aspects of the invention is to, in such a solid-state imaging apparatus, improve the linearity of a signal voltage relative to a change in illuminance. Furthermore, a third advantage of some aspects of the invention is to provide an electronic device and the like that use such a solid-state imaging apparatus.

A solid-state imaging apparatus according to a first aspect of the invention includes: a light receiving element with a photoelectric conversion function; a readout circuit that reads out pixel information from the light receiving element, and outputs an output voltage; a CDS circuit that is composed of three-stage common source circuits, and generates a pixel signal based on a difference between an output voltage output from the readout circuit at the time of reset and an output voltage output based on the readout of the pixel information, the three-stage common source circuits being connected in series to one another and provided with direct-current cut elements that are each disposed on a corresponding one of input paths of the three-stage common source circuits; and a bias voltage supply circuit that supplies a direct-current bias voltage to gates of transistors of the three-stage common source circuits.

According to the first aspect of the invention, as the CDS circuit is composed of the three-stage common source circuits, the circuit area and the current consumption are not very large. Furthermore, as each of the direct-current cut elements disposed on the input paths of the common source circuits blocks the direct-current components of a preceding stage, a defective portion of the CDS circuit is easily detected by stopping the operations of the CDS circuit through control of the direct-current bias voltage by the bias voltage supply circuit.

Here, it is preferable that the bias voltage supply circuit supplies the direct-current bias voltage separately to the gates of the transistors of the three-stage common source circuits so that each of gate voltages of the transistors exceeds a threshold voltage. In this way, operating points that are respectively appropriate for the transistors can be set, and the linearity of a signal voltage relative to a change in illuminance can be improved.

Furthermore, it is preferable that the bias voltage supply circuit supplies the direct-current bias voltage to the gate of the transistor of the common source circuit in a first stage and the gate of the transistor of the common source circuit in a second stage, in accordance with an output voltage of the readout circuit, so as to avoid overlap between a range in which a gate voltage of the transistor of the common source circuit in the first stage changes and a range in which a gate voltage of the transistor of the common source circuit in the second stage changes. In this way, the common source circuit in the first stage and the common source circuit in the second stage can be used in operating ranges that differ from each other in linearity, and the linearity error therebetween can be offset.

Furthermore, it is preferable that a voltage amplification factor of the common source circuit in the first stage is substantially equal to a voltage amplification factor of the common source circuit in the second stage. As the voltage amplification factors are easily adjusted in the common source circuits, adjusting the voltage amplification factor of the common source circuit in the first stage and the voltage amplification factor of the common source circuit in the second stage to be substantially equal to each other allows for a smooth increase in a signal amplitude.

In the foregoing configurations, it is preferable that each of gate voltages of the transistors of the three-stage common source circuits changes, in accordance with an output voltage of the readout circuit, between a voltage equal to or lower than a threshold voltage and a voltage higher than the threshold voltage. In this way, the input/output characteristics of a cubic function are achieved, thereby increasing an input voltage range with a small linearity error.

Furthermore, it is preferable that the direct-current cut elements include capacitors, and in advance of the readout of the pixel information by the readout circuit, the bias voltage supply circuit supplies the direct-current bias voltage that sets operating points of the transistors of the three-stage common source circuits. In this case, each of the capacitors disposed on the input paths of the common source circuits constantly blocks the direct-current components of a preceding stage. Therefore, the operating points that are respectively appropriate for the transistors can be set while the readout circuit is supplying an output voltage at the time of reset to the CDS circuit.

Alternatively, it is preferable that the direct-current cut elements include switch circuits, and when the switch circuits are in an OFF state, the bias voltage supply circuit supplies the direct-current bias voltage that places the transistors of the three-stage common source circuits in an OFF state. In this case, each of the switch circuits disposed on the input paths of the common source circuits blocks the direct-current components of a preceding stage when in an OFF state. Therefore, a defective portion of the CDS circuit is easily detected by stopping the operations of the CDS circuit through control of the direct-current bias voltage by the bias voltage supply circuit.

An electronic device according to a second aspect of the invention includes the solid-state imaging apparatus with any of the foregoing configurations, and a signal processor that processes a pixel signal generated by the solid-state imaging apparatus. The second aspect of the invention can provide the electronic device that allows for easy inspection with small power consumption by using the solid-state imaging apparatus including the CDS circuit that allows for easy detection of a defective portion without making the circuit area and the current consumption very large.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes an embodiment of the invention in detail with reference to the drawings. Note that the same constituent elements are given the same reference signs to omit redundant explanations.

The following describes, as an electronic device according to one embodiment of the invention, a CIS-type scanner apparatus using a contact image sensor (CIS) module that serves as a solid-state imaging apparatus according to one embodiment of the invention and includes image sensor ICs. This scanner apparatus may be integrated with, for example, a printer or a facsimile apparatus.

Scanner Apparatus

Figure 1:
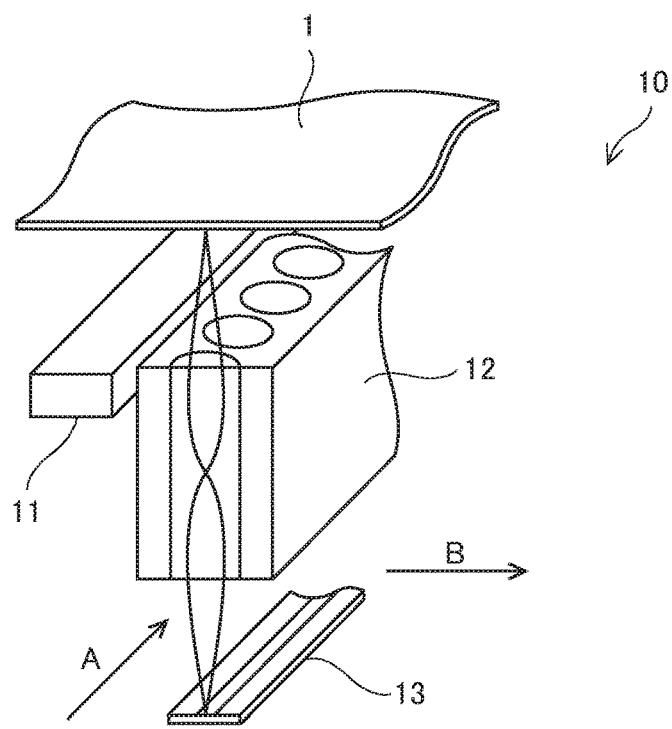
FIG. 1 is a perspective view showing an exemplary configuration of a CIS module.
Figure 2:
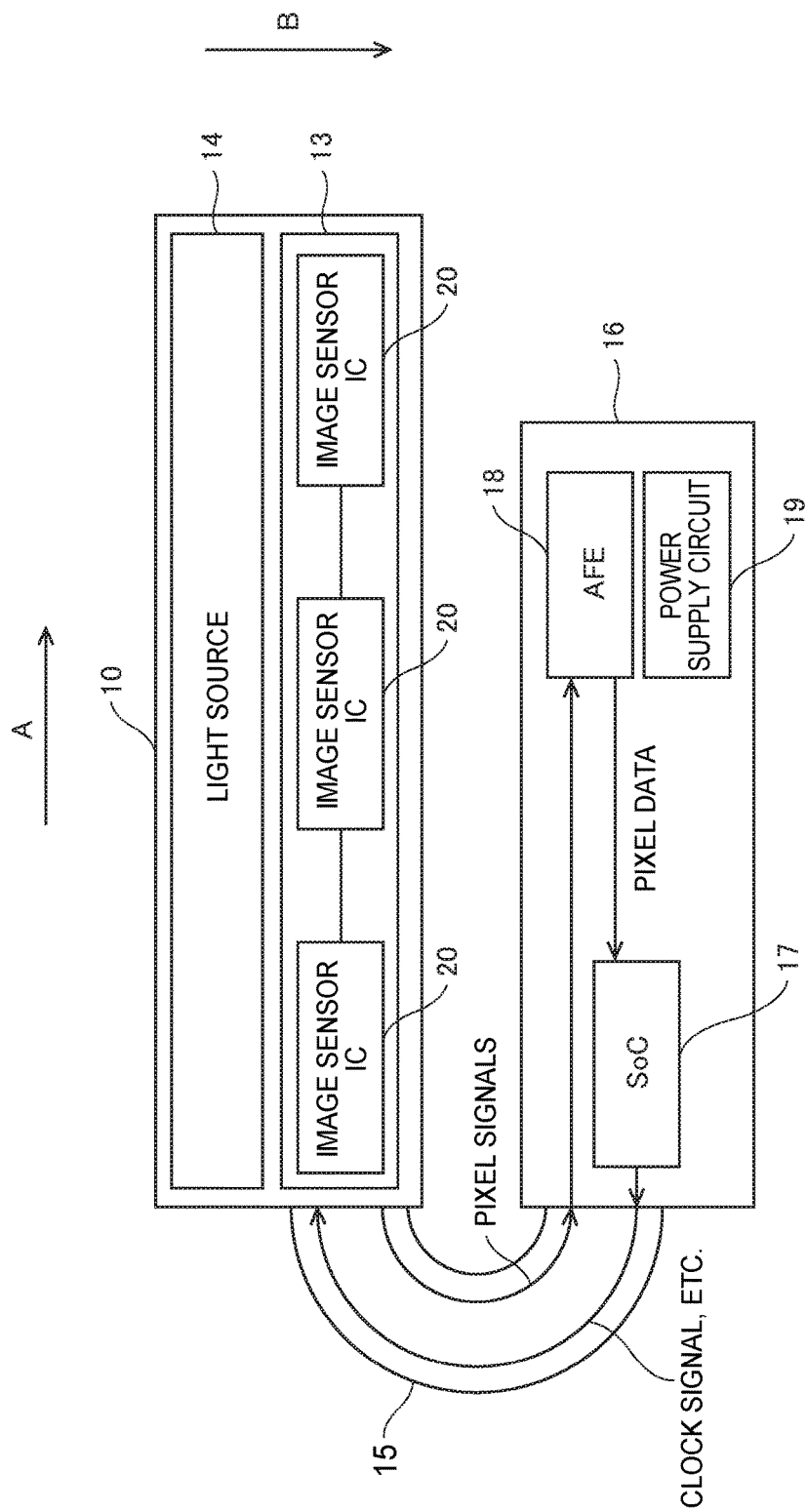
FIG. 2 is a block diagram showing an exemplary configuration of a scanner apparatus using the CIS module.

FIG. 1 is a perspective view showing an exemplary configuration of a CIS module, and FIG. 2 is a block diagram showing an exemplary configuration of a scanner apparatus using the CIS module shown in FIG. 1. As shown in FIG. 1, the CIS module 10 includes a light guide 11 that illuminates an original 1 with light, a lens array 12 including a plurality of lenses that form an image of reflected light from the original 1, and an image sensor 13 including a plurality of light receiving elements that are arranged at the position where the image of reflected light is formed.

The CIS module 10 may further include a light source 14 (FIG. 2) that generates light that is made incident on an end portion of the light guide 11. In the case of a color scanner, the light source 14 includes red (R), green (G), and blue (B) LEDs, for example. The LEDs in three colors are lit using pulses according to a time-division method.

The light guide 11 guides light so that a region of the original 1 extending along a main scanning direction A is illuminated with light generated by the light source 14. The lens array 12 is composed of, for example, a rod lens array and the like. The image sensor 13 includes a plurality of pixels lying along the main scanning direction A, and moves in a sub scanning direction B together with the light guide 11, the lens array 12, etc.

As shown in FIG. 2, the image sensor 13 may be composed of a plurality of image sensor ICs 20 that are connected in series to one another. For example, twelve image sensor ICs 20 are connected in series to one another. In one example, each image sensor IC 20 has a shape of a long and thin rectangle with long sides of approximately 18 mm to 20 mm in length, and short sides of 0.5 mm or less in length.

The CIS module 10, which is movable in the sub scanning direction B, is connected via a flexible wire 15 to a main substrate 16 that is fixed to the scanner apparatus. A system on chip (SoC) 17, an analog front-end (AFE) 18, and a power supply circuit 19 are mounted on the main substrate 16.

The system on chip 17 supplies a clock signal, a control signal, and the like to the CIS module 10. The image sensor ICs 20 of the CIS module 10 generate pixel signals corresponding to the intensity of reflected light from the original 1, and supply the pixel signals to the analog front-end 18. The analog front-end 18 generates digital pixel data by applying analog-to-digital conversion to the analog pixel signals, and supplies the pixel data to the system on chip 17.

The system on chip 17 is a semiconductor integrated circuit (IC) generated by integrating a plurality of processing functions, including a CPU, into one chip. Together with the analog front-end 18, the system on chip 17 composes a signal processor that processes the pixel signals generated by the image sensor ICs 20.

For example, the system on chip 17 generates image data based on the pixel data supplied from the analog front-end 18, and outputs the image data to, for example, a printing unit of the printer or a communication unit of the facsimile apparatus. Alternatively, the system on chip 17 may perform printing on a sheet based on the image data by controlling the printing unit of the printer, and may transmit the image data to the outside by controlling the communication unit of the facsimile apparatus.

The power supply circuit 19 supplies a power supply voltage and the like to the CIS module 10, the system on chip 17, and the analog front-end 18. Note that, for example, the analog front-end 18, a part of the power supply circuit 19, or a light source driver may be mounted on the CIS module 10.

Image Sensor ICs

Figure 3:
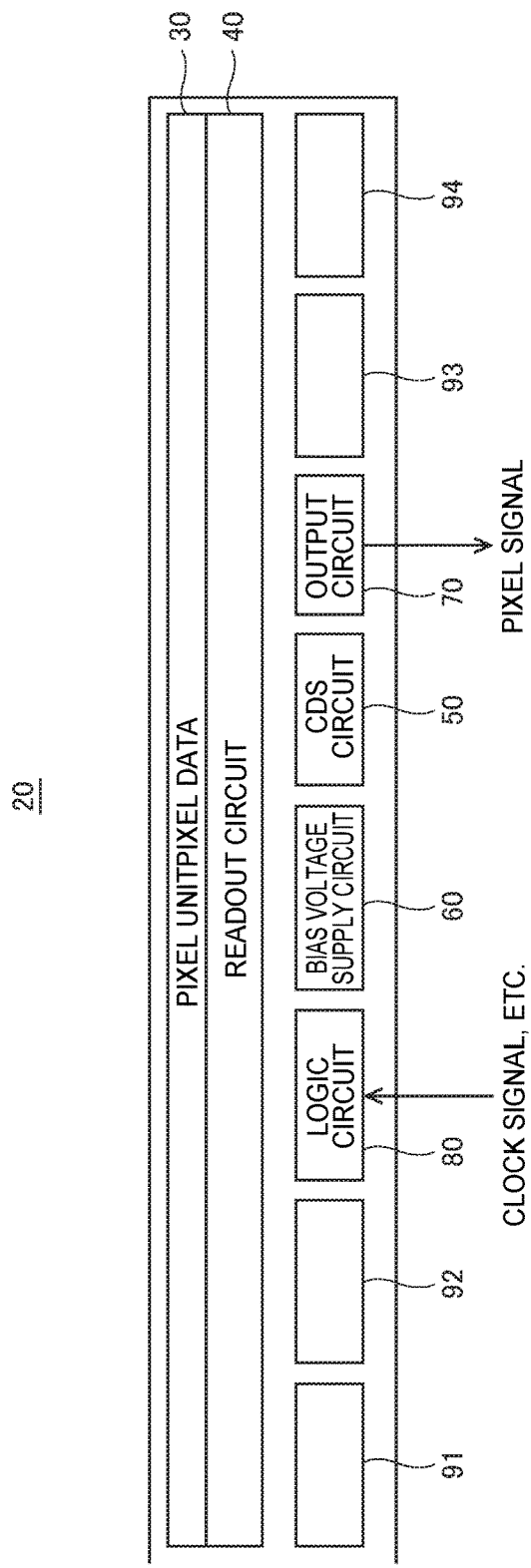
FIG. 3 is a block diagram showing a schematic configuration of each image sensor IC shown in FIG. 2.

FIG. 3 is a block diagram showing a schematic configuration of each image sensor IC shown in FIG. 2. As shown in FIG. 3, each image sensor IC 20 includes a pixel unit 30, a readout circuit 40, a CDS (correlated double sampling) circuit 50, a bias voltage supply circuit 60, an output circuit 70, a logic circuit 80, and capacitors 91 to 94.

In the pixel unit 30, a light receiving element with a photoelectric conversion function is arranged in each of a plurality of pixels (e.g., 864 pixels). The readout circuit 40 reads out pixel information from the light receiving elements, and outputs an output voltage. The output voltage of the readout circuit 40 is supplied to the CDS circuit 50.

The CDS circuit 50 applies correlated double sampling processing to the output voltage of the readout circuit 40. That is to say, the CDS circuit 50 generates a pixel signal based on a difference between an output voltage output from the readout circuit 40 at the time of reset and an output voltage output based on the readout of pixel information. As a result, variations in an offset voltage between the plurality of pixels can be cancelled out, and a pixel signal corresponding to the intensity of light can be generated.

The bias voltage supply circuit 60 supplies a direct-current bias voltage to a plurality of transistors in the CDS circuit 50. The pixel signal generated by the CDS circuit 50 is supplied to the output circuit 70. The output circuit 70 is composed of, for example, an operational amplifier and the like, buffers the pixel signal supplied from the CDS circuit 50, and outputs the pixel signal to the analog front-end 18 (FIG. 2).

The logic circuit 80 is composed of a logic circuit including a combinational circuit or a sequential circuit, and controls the readout circuit 40 and the bias voltage supply circuit 60 in accordance with the clock signal, the control signal, and the like supplied from the system on chip 17 shown in FIG. 2. The capacitors 91 to 94 are connected between a wire of a power supply potential on a high-potential side and a wire of a power supply potential on a low-potential side in each image sensor IC 20, and stabilize the power supply voltage.

First Exemplary Configuration

Figure 4:
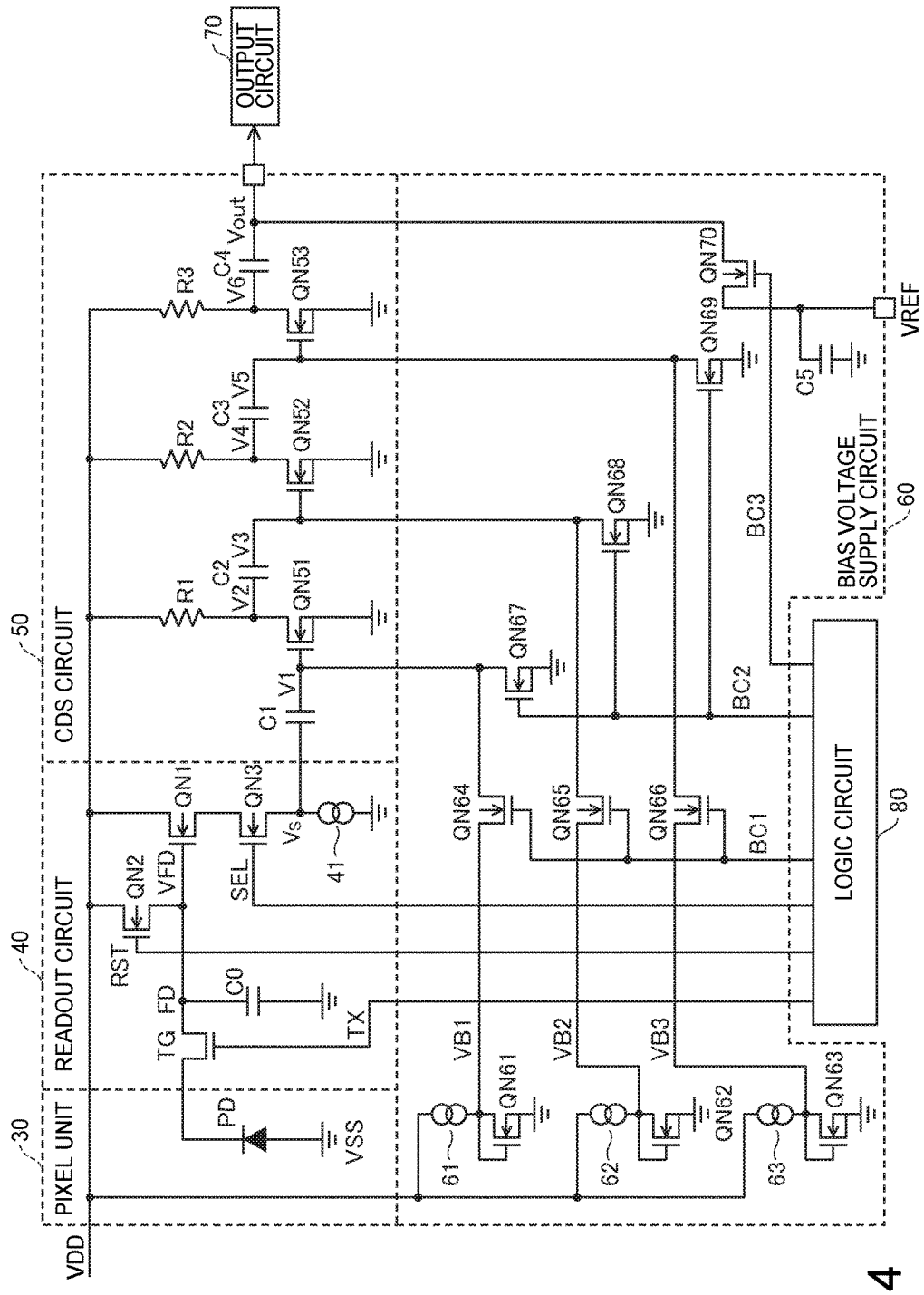
FIG. 4 is a circuit diagram showing a first exemplary configuration of the image sensor IC shown in FIG. 3.

FIG. 4 is a circuit diagram showing a first exemplary configuration of the image sensor IC shown in FIG. 3. Regarding the pixel unit 30 and the readout circuit 40, an equivalent circuit corresponding to one pixel is shown. For example, a photodiode PD is arranged as the light receiving element with the photoelectric conversion function in one pixel of the pixel unit 30. Signal charges corresponding to the intensities of incident light are accumulated in the photodiode PD.

The readout circuit 40 reads out pixel information from the photodiode PD and generates an output voltage Vs by converting the signal charges accumulated in the photodiode PD into a signal voltage. For example, the readout circuit 40 includes a transfer gate TG, a charge storage capacitor C0, a buffer transistor QN1, a reset transistor QN2, a selection transistor QN3, and a constant current supply 41. The constant current supply 41 is shared by all pixels. Furthermore, when an analog shift register is provided at the last stage of the readout circuit 40, the selection transistor QN3 can be included in the analog shift register.

The charge storage capacitor C0 is composed of, for example, a P-type semiconductor layer (e.g., a semiconductor substrate or a well), and an N-type floating diffusion FD arranged inside the P-type semiconductor layer. The transfer gate TG includes a gate electrode that is arranged on the P-type semiconductor layer via a gate insulating film, and is disposed between a cathode of the photodiode PD and the floating diffusion FD.

The photodiode PD and the transfer gate TG are connected in series to each other between a wire of a power supply potential VSS on a low-potential side and a gate of the buffer transistor QN1. FIG. 4 depicts a case in which the power supply potential VSS is a ground potential (0 V). The buffer transistor QN1 includes a drain connected to a wire of a power supply potential VDD on a high-potential side, and outputs, from a source, a voltage corresponding to a voltage VFD of the floating diffusion FD applied to the gate.

The reset transistor QN2 includes a drain connected to the wire of the power supply potential VDD, a source connected to the gate of the buffer transistor QN1, and a gate to which a reset signal RST is applied. The reset transistor QN2 is placed in an ON state and pulls up the gate of the buffer transistor QN1 when the reset signal RST is activated to a high level.

The selection transistor QN3 includes a drain connected to the source of the buffer transistor QN1, a source connected to one end of the constant current supply 41, and a gate to which a pixel selection signal SEL is applied. The other end of the constant current supply 41 is connected to the wire of the power supply potential VSS.

In sequential selection of the plurality of pixels in the main scanning direction A (FIG. 2), the selection transistor QN3 is placed in an ON state and the buffer transistor QN1 operates as a source follower circuit when the pixel selection signal SEL is activated to a high level. As a result, the output voltage Vs of the readout circuit 40 is output from the source of the buffer transistor QN1 to the CDS circuit 50 via the selection transistor QN3.

The CDS circuit 50 is composed of three-stage common source circuits that are connected in series to one another, and generates a pixel signal based on a difference between an output voltage output from the readout circuit 40 at the time of reset and an output voltage output based on the readout of pixel information. A direct-current cut element is disposed on each of input paths of the three-stage common source circuits. In the first exemplary configuration shown in FIG. 4, capacitors C1 to C3 are used as the direct-current cut elements.

The common source circuit in the first stage includes, for example, the capacitor C1, an N-channel MOS transistor QN51, and a resistor R1. The transistor QN51 includes a drain connected to the wire of the power supply potential VDD via the resistor R1, a source connected to the wire of the power supply potential VSS, and a gate to which the output voltage Vs of the readout circuit 40 is applied via the capacitor C1. The transistor QN51 amplifies the output voltage Vs of the readout circuit 40, and outputs the amplified voltage from the drain.

The common source circuit in the second stage includes, for example, the capacitor C2, an N-channel MOS transistor QN52, and a resistor R2. The transistor QN52 includes a drain connected to the wire of the power supply potential VDD via the resistor R2, a source connected to the wire of the power supply potential VSS, and a gate to which the output voltage of the common source circuit in the first stage is applied via the capacitor C2. The transistor QN52 amplifies the output voltage of the common source circuit in the first stage, and outputs the amplified voltage from the drain.

The common source circuit in the third stage includes, for example, the capacitor C3, an N-channel MOS transistor QN53, and a resistor R3. The transistor QN53 includes a drain connected to the wire of the power supply potential VDD via the resistor R3, a source connected to the wire of the power supply potential VSS, and a gate to which the output voltage of the common source circuit in the second stage is applied via the capacitor C3. The transistor QN53 amplifies the output voltage of the common source circuit in the second stage, and outputs the amplified voltage from the drain to the output circuit 70 via a capacitor C4.

The bias voltage supply circuit 60 supplies a direct-current bias voltage to the gates of the transistors QN51 to QN53 of the three-stage common source circuits included in the CDS circuit 50. The bias voltage supply circuit 60 also supplies a direct-current bias voltage to the output circuit 70.

For example, the bias voltage supply circuit 60 includes constant current supplies 61 to 63 that are each connected at one end to the wire of the power supply potential VDD, N-channel MOS transistors QN61 to QN63 that are respectively connected to the other ends of the constant current supplies 61 to 63, N-channel MOS transistors QN64 to QN70 serving as switch circuits, and a capacitor C5.

The transistors QN61 to QN63 include drains and gates that are respectively connected to the other ends of the constant current supplies 61 to 63, and sources that are connected to the wire of the power supply potential VSS. The transistors QN61 to QN63 respectively generate direct-current bias voltages VB1 to VB3, which are equal to a gate-source voltage, at points of drain-gate connection.

The transistors QN61 to QN63 may respectively be set to be the same as the transistors QN51 to QN53 of the CDS circuit 50 in size. In this case, a pair of the transistors QN61 and QN51, a pair of the transistors QN62 and QN52, and a pair of the transistors QN63 and QN53 each compose a current mirror circuit. When the transistors QN51 to QN53 have different sizes, the transistors QN61 to QN63 also have different sizes, and the direct-current bias voltages VB1 to VB3 have different magnitudes as well.

The transistors QN64 to QN66 include drains that are respectively connected to the points of drain-gate connection of the transistors QN61 to QN63, sources that are respectively connected to the gates of the transistors QN51 to QN53 of the CDS circuit 50, and gates to which a bias control signal BC1 is applied. The transistors QN64 to QN66 are placed in an ON state and respectively supply the direct-current bias voltages VB1 to VB3 to the gates to the transistors QN51 to QN53 when the bias control signal BC1 is activated to a high level.

The bias voltage supply circuit 60 can supply the direct-current bias voltages VB1 to VB3, separately and respectively, to the gates of the transistors QN51 to QN53 of the three-stage common source circuits included in the CDS circuit 50 so that the gate voltages of the transistors QN51 to QN53 exceed their respective threshold voltages. In this way, the operating points (bias points) that are respectively appropriate for the transistors QN51 to QN53 can be set, and the linearity of a signal voltage relative to a change in illuminance can be improved.

The transistors QN67 to QN69 include drains that are respectively connected to the gates of the transistors QN51 to QN53 of the CDS circuit 50, sources that are connected to the wire of the power supply potential VSS, and gates to which a bias control signal BC2 is applied. The transistors QN67 to QN69 are placed in an ON state and reduce the gate voltages of the transistors QN51 to QN53 to substantially 0 V when the bias control signal BC2 is activated to a high level. In a normal operation mode, the bias control signal BC2 is deactivated to a low level, and the transistors QN67 to QN69 are in an OFF state.

The capacitor C5, for example, is connected between a terminal to which a reference voltage VREF is supplied from the power supply circuit 19 (FIG. 2) and the wire of the power supply potential VSS, and stabilizes the reference voltage VREF. The transistor QN70 includes a drain connected to the terminal to which the reference voltage VREF is supplied, a source connected to an output terminal of the CDS circuit 50, and a gate to which a bias control signal BC3 is applied. The transistor QN70 is placed in an ON state and supplies the reference voltage VREF to the output circuit 70 via the output terminal of the CDS circuit 50 when the bias control signal BC3 is activated to a high level.

Under control of the system on chip 17 (FIG. 2), the logic circuit 80 supplies a transfer control signal TX to the transfer gate TG, supplies the reset signal RST to the gate of the reset transistor QN2, and supplies the pixel selection signal SEL to the gate of the selection transistor QN3. Furthermore, the logic circuit 80 supplies the bias control signal BC1 to the gates of the transistors QN64 to QN66, supplies the bias control signal BC2 to the gates of the transistors QN67 to QN69, and supplies the bias control signal BC3 to the gate of the transistor QN70.

Description of Operations

Figure 5:
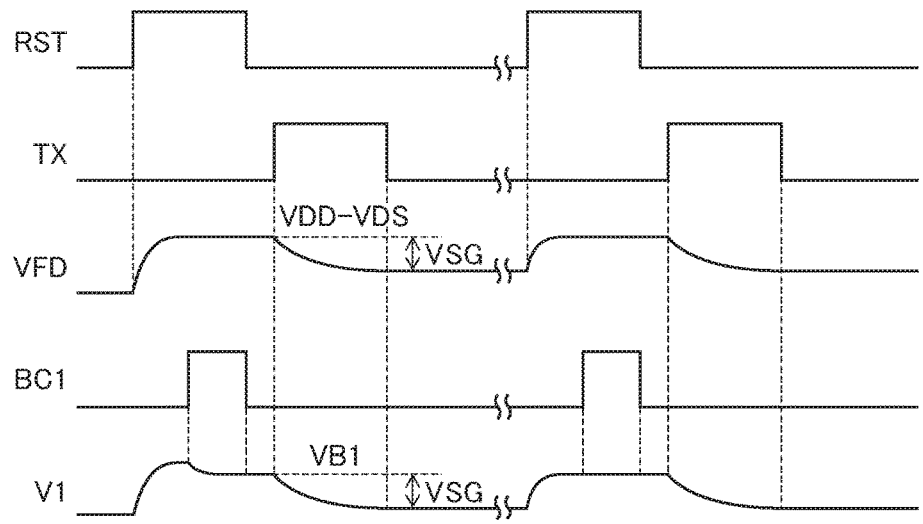
FIG. 5 is a waveform diagram for describing the operations of the image sensor IC shown in FIG. 4.

FIG. 5 is a waveform diagram for describing the operations of the image sensor IC shown in FIG. 4. When the reset signal RST is activated to a high level, the reset transistor QN2 of the readout circuit 40 is placed in an ON state and resets the voltage VFD of the floating diffusion FD to an initial state. Provided that a drain-source voltage of the reset transistor QN2 is VDS, the voltage VFD of the floating diffusion FD is reset to a voltage at the time of reset (VDD−VDS).

When the reset signal RST is deactivated to a low level, the reset transistor QN2 is placed in an OFF state and the reset is cancelled. Thereafter, when the transfer control signal TX is activated to a high level, the transfer gate TG transfers the signal charges accumulated in the photodiode PD of the pixel unit 30 to the charge storage capacitor C0. The charge storage capacitor C0 converts the transferred signal charges into a signal voltage. As a result, the voltage VFD of the floating diffusion FD is determined.

In a period in which the transfer control signal TX is activated, as the photodiode PD transfers negative signal charges to the charge storage capacitor C0, the voltage VFD of the floating diffusion FD decreases from the voltage at the time of reset (VDD−VDS) to a voltage following the readout of pixel information. The difference between the voltage at the time of reset (VDD−VDS) and the voltage following the readout of pixel information is equivalent to a signal voltage VSG. The readout circuit 40 outputs the output voltage Vs corresponding to the voltage VFD of the floating diffusion FD to the CDS circuit 50.

The bias control signal BC1 is activated to a high level only in a predetermined period that follows the activation of the reset signal RST and precedes the activation of the transfer control signal TX. Therefore, the transistors QN64 to QN66 of the bias voltage supply circuit 60 supply the direct-current bias voltages VB1 to VB3, which set the operating points of the transistors QN51 to QN53 of the three-stage common source circuits included in the CDS circuit 50, in advance of the readout of pixel information by the readout circuit 40.

In the first exemplary configuration, each of the capacitors C1 and C2 disposed on the input paths of the common source circuits constantly blocks the direct-current components of a preceding stage. Therefore, the operating points that are respectively appropriate for the transistors QN51 to QN53 can be set while the readout circuit 40 is supplying an output voltage at the time of reset to the CDS circuit 50.

In a period in which the bias control signal BC1 is activated to a high level, the gate voltage V1 of the transistor QN51 of the common source circuit in the first stage is clamped at the direct-current bias voltage VB1 supplied from the bias voltage supply circuit 60. Similarly, the gate voltage V3 of the transistor QN52 of the common source circuit in the second stage is clamped at the direct-current bias voltage VB2, and the gate voltage V5 of the transistor QN53 of the common source circuit in the third stage is clamped at the direct-current bias voltage VB3.

The bias control signal BC3 is similarly activated to a high level only in a predetermined period that follows the activation of the reset signal RST and precedes the activation of the transfer control signal TX. Therefore, the transistor QN70 of the bias voltage supply circuit 60 supplies the reference voltage VREF, which sets the operating point of the output circuit 70, to the output terminal of the CDS circuit 50 in advance of the readout of pixel information by the readout circuit 40. In a period in which the bias control signal BC3 is activated to a high level, the output voltage Vout of the CDS circuit 50 is clamped at the reference voltage VREF.

Thereafter, the bias control signals BC1 and BC3 are deactivated to a low level, and the transfer control signal TX is activated to a high level. In a period in which the transfer control signal TX is activated, the gate voltage V1 of the transistor QN51 of the common source circuit in the first stage changes based on the direct-current bias voltage VB1 in accordance with the signal voltage VSG, which is a difference between an output voltage output from the readout circuit 40 at the time of reset and an output voltage output based on the readout of pixel information.

Similarly, the gate voltage V3 of the transistor QN52 of the common source circuit in the second stage changes based on the direct-current bias voltage VB2 in accordance with the signal voltage VSG that has been amplified in one stage. The gate voltage V5 of the transistor QN53 of the common source circuit in the third stage changes based on the direct-current bias voltage VB3 in accordance with the signal voltage VSG that has been amplified in two stages.

Furthermore, the output voltage Vout of the CDS circuit 50 changes based on the reference voltage VREF in accordance with the signal voltage VSG that has been amplified in three stages. As a result, the CDS circuit 50 can cancel out variations in an offset voltage between the plurality of pixels, and generate a pixel signal corresponding to the intensity of light.

Operation Stop Function

The image sensor IC shown in FIG. 4 has an operation stop function for stopping the operations of the CDS circuit 50 in a test mode. Therefore, when it is determined that the CDS circuit 50 is defective in an operation test, the operation stop function can be used to detect a defective portion.

For example, in the test mode, the logic circuit 80 deactivates the bias control signal BC1 to a low level, and activates the bias control signal BC2 to a high level. Accordingly, in the bias voltage supply circuit 60, the transistors QN64 to QN66 are placed in an OFF state, and the transistors QN67 to QN69 are placed in an ON state. Therefore, the bias voltage supply circuit 60 supplies the direct-current bias voltages (substantially 0 V) with which the transistors QN51 to QN53 of the three-stage common source circuits included in the CDS circuit 50 are placed in an OFF state.

As a result, in the CDS circuit 50, the transistors QN51 to QN53 of the three-stage common source circuits are placed in an OFF state. At this time, by checking whether the drain potentials of the transistor QN51 to QN53 increase to the power supply potential VDD, a defective portion of the transistors QN51 to QN53, the capacitors C1 to C4, the resistors R1 to R3, or the wires can be detected and the causes of the defect can be analyzed.

Operating Voltages of Various Components

Provided that the output voltage Vs of the readout circuit 40 based on the voltage at the time of reset is an input voltage Vin of the CDS circuit 50, the gate voltage V1 of the transistor QN51 of the common source circuit in the first stage is expressed by the following Expression 1.

$$V1 = VB1 + Vin \qquad \text{Expression 1:}$$

Therefore, using transconductance gm1 of the transistor QN51, the drain voltage of the transistor QN51 (the output voltage of the common source circuit in the first stage) V2 is expressed by the following Expression 2.

$$V2 = VB1 - gm1 \cdot R1 \cdot Vin \qquad \text{Expression 2:}$$

Furthermore, the gate voltage V3 of the transistor QN52 of the common source circuit in the second stage is expressed by the following Expression 3.

$$V3 = VB2 - gm1 \cdot R1 \cdot Vin \qquad \text{Expression 3:}$$

Therefore, using transconductance gm2 of the transistor QN52, the drain voltage of the transistor QN52 (the output voltage of the common source circuit in the second stage) V4 is expressed by the following Expression 4.

$$V4 = VB2 + gm1 \cdot gm2 \cdot R1 \cdot R2 \cdot Vin \qquad \text{Expression 4:}$$

Furthermore, the gate voltage V5 of the transistor QN53 of the common source circuit in the third stage is expressed by the following Expression 5.

$$V5 = VB3 + gm1 \cdot gm2 \cdot R1 \cdot R2 \cdot Vin \qquad \text{Expression 5:}$$

Therefore, using transconductance gm3 of the transistor QN53, the drain voltage of the transistor QN53 (the output voltage of the common source circuit in the third stage) V6 is expressed by the following Expression 6.

$$V6 = VB3 - gm1 \cdot gm2 \cdot gm3 \cdot R1 \cdot R2 \cdot R3 \cdot Vin \qquad \text{Expression 6:}$$

Furthermore, the output voltage Vout of the CDS circuit 50 supplied to the output circuit 70 is expressed by the following Expression 7.

$$Vout = VREF - gm1 \cdot gm2 \cdot gm3 \cdot R1 \cdot R2 \cdot R3 \cdot Vin \qquad \text{Expression 7:}$$

In the foregoing manner, the CDS circuit 50 generates the output voltage Vout as a pixel signal. Although the voltages of various components are calculated without consideration of attenuation caused by the capacitors C1 to C4 in the foregoing description, there is a case in which the voltage amplitude of the pixel signal decreases to approximately 80% to 90% in the common source circuit in each stage depending on the capacitance ratio between the capacitors C1 to C4 and parasitic capacitance between the wires and the like.

Exemplary Settings for Operating Points

In the common source circuits in the first to third stages shown in FIG. 4, the operating points can be set independently of one another because each of the capacitors C1 to C3 constantly blocks the direct-current components of a preceding stage. For example, the operating points may be set so as to achieve the best linearity in the input/output characteristics of each common source circuit, or the operating points may be set so as to offset the linearity error in another common source circuit.

Figure 6:
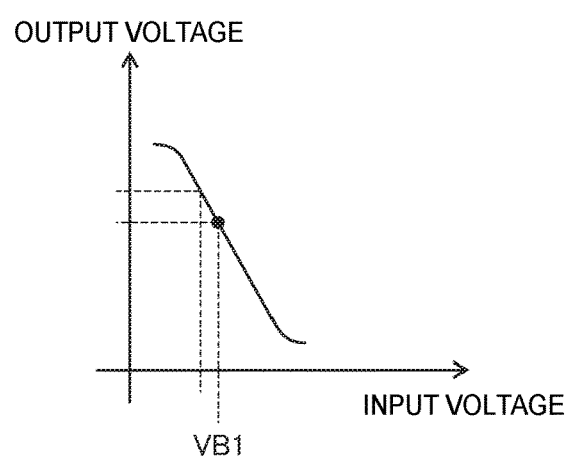
FIG. 6 shows exemplary input/output characteristics of a common source circuit in the first stage shown in FIG. 4.

FIG. 6 shows exemplary input/output characteristics of the common source circuit in the first stage shown in FIG. 4. An input voltage based on the direct-current bias voltage VB1 is applied to the gate of the transistor QN51 of the common source circuit in the first stage. For example, the direct-current bias voltage VB1 is 0.95 V, and the input voltage is in the range of 0.85 V to 0.95 V. The transistor QN51 amplifies the 0.1-V amplitude of the input voltage to substantially twice its original amplitude, and outputs an output voltage having an amplitude of 0.2 V from the drain.

Figure 7:
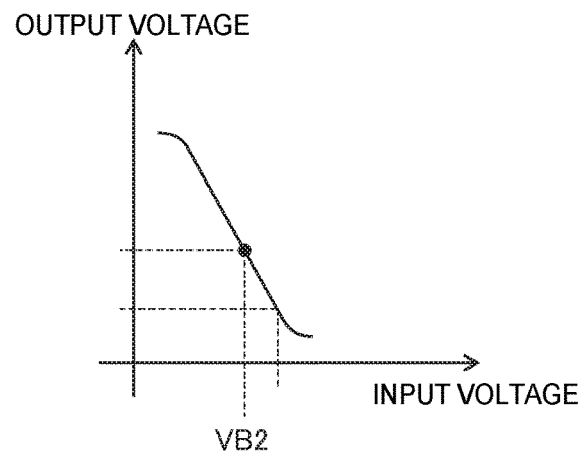
FIG. 7 shows exemplary input/output characteristics of a common source circuit in the second stage shown in FIG. 4.

FIG. 7 shows exemplary input/output characteristics of the common source circuit in the second stage shown in FIG. 4. An input voltage based on the direct-current bias voltage VB2 is applied to the gate of the transistor QN52 of the common source circuit in the second stage. For example, the direct-current bias voltage VB2 is 1.1 V, and the input voltage is in the range of 1.1 V to 1.3 V. The transistor QN52 amplifies the 0.2-V amplitude of the input voltage to substantially twice its original amplitude, and outputs an output voltage having an amplitude of 0.4 V from the drain.

Figure 8:
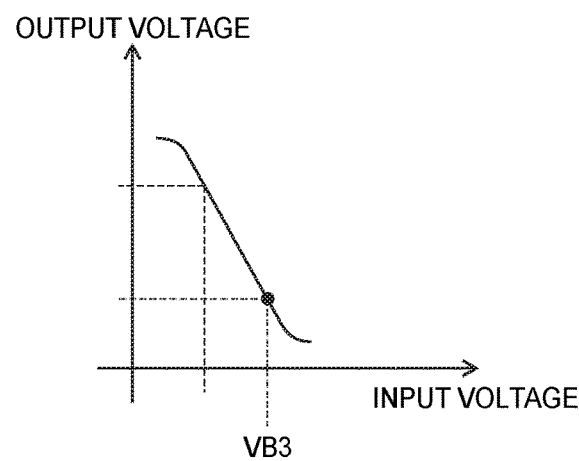
FIG. 8 shows exemplary input/output characteristics of a common source circuit in the third stage shown in FIG. 4.

FIG. 8 shows exemplary input/output characteristics of the common source circuit in the third stage shown in FIG. 4. An input voltage based on the direct-current bias voltage VB3 is applied to the gate of the transistor QN53 of the common source circuit in the third stage. For example, the direct-current bias voltage VB3 is 1.3 V, and the input voltage is in the range of 0.9 V to 1.3 V. The transistor QN53 amplifies the 0.4-V amplitude of the input voltage to substantially three times its original amplitude, and outputs an output voltage having an amplitude of 1.2 V from the drain.

With the foregoing exemplary settings, the bias voltage supply circuit 60 supplies the direct-current bias voltages VB1 and VB2 to the gates of the transistors QN51 and QN52, respectively, in accordance with the output voltage Vs of the readout circuit 40 so as to avoid overlap between the range in which the gate voltage of the transistor QN51 of the common source circuit in the first stage changes and the range in which the gate voltage of the transistor QN52 of the common source circuit in the second stage changes.

In this way, the common source circuit in the first stage and the common source circuit in the second stage can be used in operating ranges that differ from each other in linearity, and the linearity error therebetween can be offset. Furthermore, the linearity error in the entirety of the circuits may be reduced by setting the operating point of the common source circuit in the second stage so as to offset the linearity error in the common source circuit in the third stage using the linearity error in the common source circuit in the second stage.

Furthermore, with the foregoing exemplary settings, the voltage amplification factor of the common source circuit in the first stage is substantially equal to the voltage amplification factor of the common source circuit in the second stage. As the voltage amplification factors are easily adjusted in the common source circuits, adjusting the voltage amplification factor of the common source circuit in the first stage and the voltage amplification factor of the common source circuit in the second stage to be substantially equal to each other allows for a smooth increase in a signal amplitude.

Figure 9:
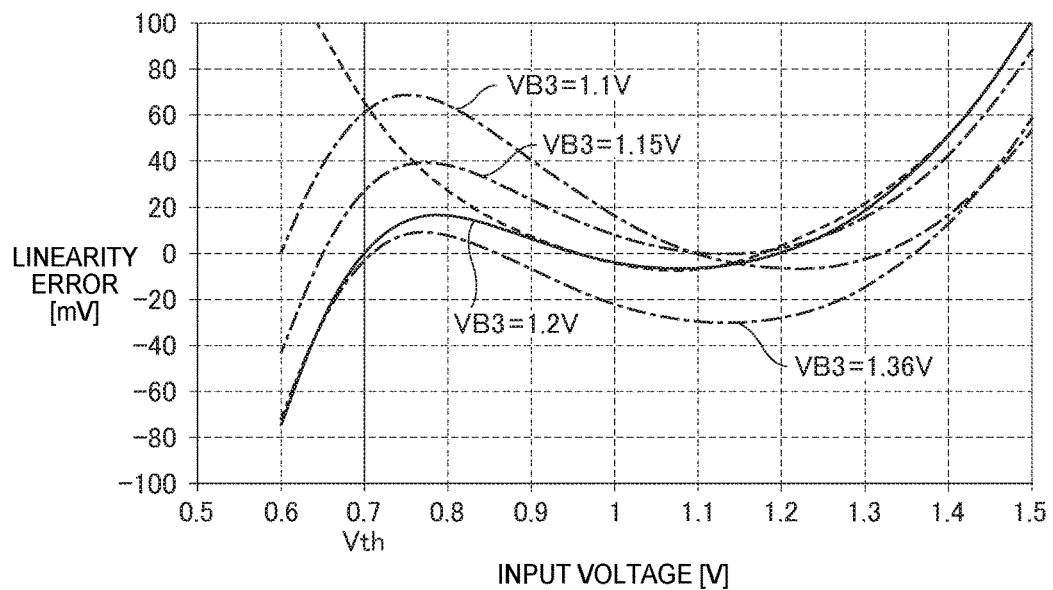
FIG. 9 shows a result of simulating the linearity error in the common source circuit in the third stage.

FIG. 9 shows an example of a result of simulating the linearity error in the common source circuit in the third stage shown in FIG. 4. In FIG. 9, a horizontal axis represents the input voltage [V] applied to the gate of the transistor QN53, and a vertical axis represents the linearity error [mV] in the drain voltage of the transistor QN53 relative to an ideal straight line connecting between a lower limit and an upper limit of the output voltage in the range of use.

A solid line in FIG. 9 indicates a case in which the direct-current bias voltage VB3 is 1.2 V. Three dash-and-dot lines in FIG. 9 indicate cases in which the direct-current bias voltage VB3 is 1.1 V, 1.15 V, and 1.36 V. Note that the power supply potential VDD is 3.3 V, and the temperature is 25° C.

If the threshold voltage of the transistor QN53 does not exert any influence, the linearity error relative to the input voltage is approximated by a quadratic curve with a downward projection as indicated by a dash line in FIG. 9. However, in reality, due to the influence of the threshold voltage Vt (e.g., 0.7 V) of the transistor QN53, the linearity error relative to the input voltage has an upward projection (pole) in the vicinity of the threshold voltage Vt as indicated by the solid line in FIG. 9.

By taking advantage of this, the direct-current bias voltage VB3 may be set lower than normal so that the gate voltage of the transistor QN53 of the common source circuit in the third stage changes between a voltage equal to or lower than the threshold voltage Vt and a voltage higher than the threshold voltage Vt in accordance with the output voltage Vs of the readout circuit 40.

In this way, the input/output characteristics of a cubic function are achieved, thereby increasing an input voltage range with a small linearity error. Furthermore, as the linearity of the input/output characteristics in the vicinity of the bias points is valued in the image sensor, it is desirable, in terms of visual characteristics, to improve the linearity of the input/output characteristics in the vicinity of the bias points by setting the direct-current bias voltage VB3 low.

Figure 10:
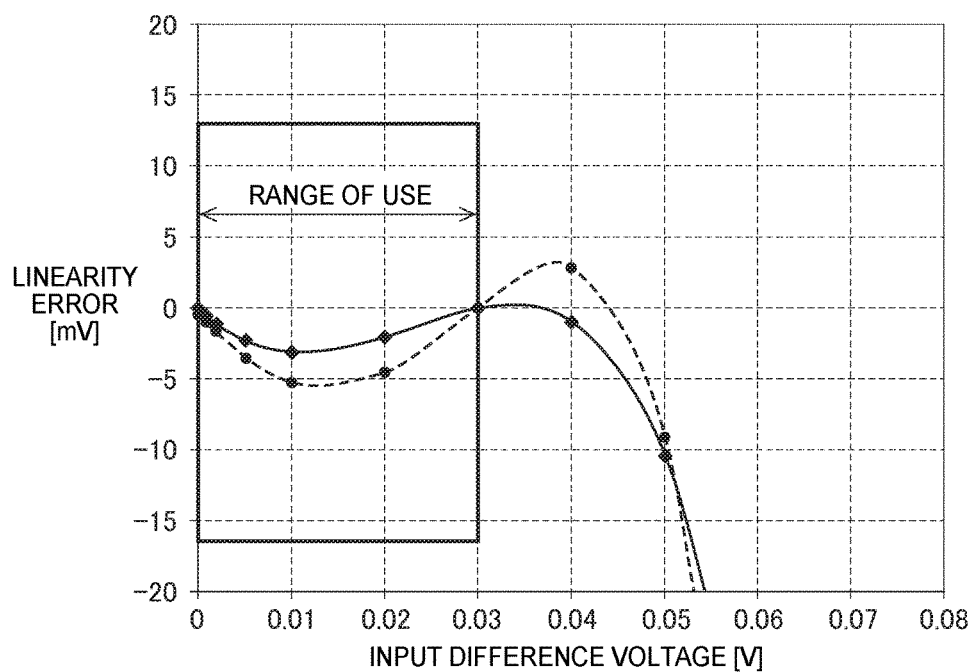
FIG. 10 shows a result of simulating the linearity error in a CDS circuit shown in FIG. 4.

FIG. 10 shows an example of a simulation result indicating a comparison between the linearity error in the CDS circuit shown in FIG. 4 and the case of a direct-connection type. In FIG. 10, a horizontal axis represents the input difference voltage [V] based on a lower limit (0 V) of the input voltage in the range of use, and a vertical axis represents the linearity error [mV] in the output voltage relative to the ideal straight line connecting between the lower limit and the upper limit of the output voltage in the range of use. Note that the power supply potential VDD is 3.3 V, and the temperature is 25° C.

A solid line in FIG. 10 indicates the linearity error in the CDS circuit 50 shown in FIG. 4. A dash line in FIG. 10 indicates the linearity error in a CDS circuit composed of three-stage common source circuits of a direct-connection type. As shown in FIG. 10, in the use of range, the linearity error in the CDS circuit 50 shown in FIG. 4 has been significantly improved compared to the linearity error in the CDS circuit of the direct-connection type.

According to the first exemplary configuration, as the CDS circuit 50 is composed of the three-stage common source circuits, the circuit area and the current consumption are not very large. Furthermore, as each of the capacitors C1 to C3 disposed on the input paths of the common source circuits blocks the direct-current components of a preceding stage, a defective portion of the CDS circuit 50 is easily detected by stopping the operations of the CDS circuit 50 through control of the direct-current bias voltages by the bias voltage supply circuit 60.

Second Exemplary Configuration

Figure 11:
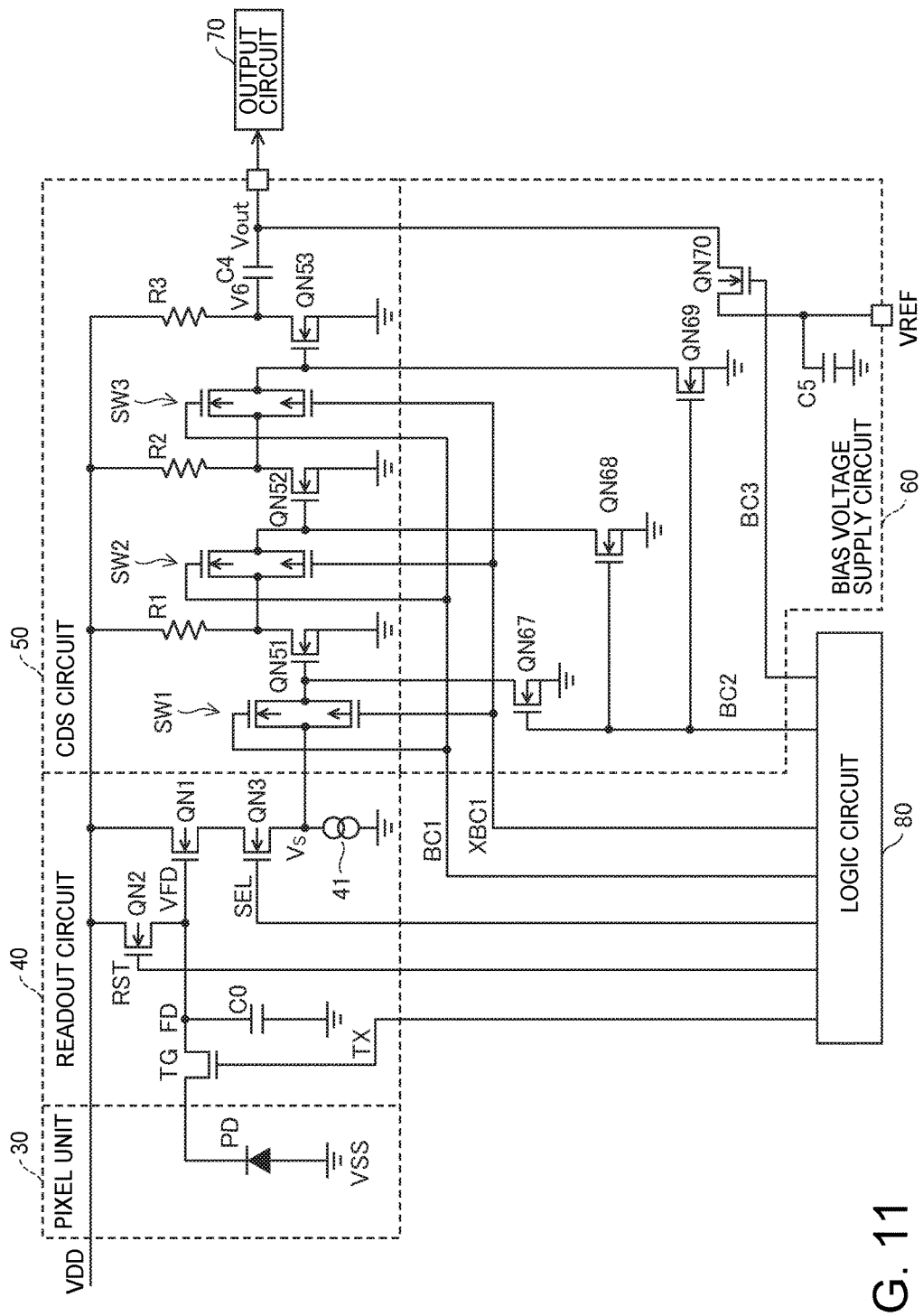
FIG. 11 is a circuit diagram showing a second exemplary configuration of the image sensor IC shown in FIG. 3.

FIG. 11 is a circuit diagram showing a second exemplary configuration of the image sensor IC shown in FIG. 3. In the second exemplary configuration, analog switches SW1 to SW3 are provided as direct-current cut elements of the CDS circuit 50 in place of the capacitors C1 to C3 according to the first exemplary configuration shown in FIG. 4, and the constant current supplies 61 to 63 and the transistors QN61 to QN66 are omitted in the bias voltage supply circuit 60. In other regards, the second exemplary configuration may be similar to the first exemplary configuration.

As shown in FIG. 11, the CDS circuit 50 is composed of three-stage common source circuits that are connected in series to one another. The analog switches SW1 to SW3 are disposed on input paths of the three-stage common source circuits, respectively. Each of the analog switches SW1 to SW3 is a switch circuit composed of an N-channel MOS transistor and a P-channel MOS transistor. The CDS circuit 50 generates a pixel signal based on a difference between an output voltage output from the readout circuit 40 at the time of reset and an output voltage output based on the readout of pixel information.

In a normal operation mode, the logic circuit 80 places the bias control signal BC1 in a high level, and also places bias control signals XBC1 and BC2 in a low level. As a result, the analog switches SW1 to SW3 are placed in an ON state and the three-stage common source circuits are directly connected to one another in the CDS circuit 50. Furthermore, in the bias voltage supply circuit 60, the transistors QN67 to QN69 are placed in an OFF state.

The bias control signal BC3 is activated to a high level only in a predetermined period that follows the activation of the reset signal RST and precedes the activation of the transfer control signal TX. Therefore, the transistor QN70 of the bias voltage supply circuit 60 supplies the reference voltage VREF, which sets the operating point of the output circuit 70, to the output terminal of the CDS circuit 50 in advance of the readout of pixel information by the readout circuit 40. In a period in which the bias control signal BC3 is activated to a high level, the output voltage Vout of the CDS circuit 50 is clamped at the reference voltage VREF.

Thereafter, the bias control signal BC3 is deactivated to a low level, and the transfer control signal TX is activated to a high level. In a period in which the transfer control signal TX is activated, the output voltage Vout of the CDS circuit 50 changes based on the reference voltage VREF in accordance with the signal voltage that has been amplified in three stages. As a result, the CDS circuit 50 can cancel out variations in an offset voltage between the plurality of pixels, and generate a pixel signal corresponding to the intensity of light.

In the test mode, the logic circuit 80 places the bias control signal BC1 in a low level, and also places the bias control signals XBC1 and BC2 in a high level. As a result, in the CDS circuit 50, each of the analog switches SW1 to SW3 is placed in an OFF state and blocks the direct-current components of a preceding stage. Furthermore, in the bias voltage supply circuit 60, the transistors QN67 to QN69 are placed in an ON state. Therefore, when the analog switches SW1 to SW3 are in an OFF state, the bias voltage supply circuit 60 supplies the direct-current bias voltages (substantially 0 V) with which the transistors QN51 to QN53 of the three-stage common source circuits included in the CDS circuit 50 are placed in an OFF state.

As a result, in the CDS circuit 50, the transistors QN51 to QN53 of the three-stage common source circuits are placed in an OFF state. At this time, by checking whether the drain potentials of the transistor QN51 to QN53 increase to the power supply potential VDD, a defective portion of the transistors QN51 to QN53, the capacitors C1 to C4, the resistors R1 to R3, or the wires can be detected and the causes of the defect can be analyzed.

According to the second exemplary configuration, as the CDS circuit 50 is composed of the three-stage common source circuits, the circuit area and the current consumption are not very large. Furthermore, as each of the analog switches SW1 to SW3 disposed on the input paths of the common source circuits blocks the direct-current components of a preceding stage when in an OFF state, a defective portion of the CDS circuit 50 is easily detected by stopping the operations of the CDS circuit 50 through control of the direct-current bias voltages by the bias voltage supply circuit 60.

The present embodiment can provide the electronic device that allows for easy inspection with small power consumption by using the solid-state imaging apparatus including the CDS circuit 50 that allows for easy detection of a defective portion without making the circuit area and the current consumption very large.

Although the common source circuits use the N-channel MOS transistors in the description of the foregoing embodiment, the common source circuits may use P-channel MOS transistors. As such, the invention is not limited to the foregoing embodiment, and can be modified in various ways by a person of ordinary skill in the art within the technical ideas of the invention.

This application claims priority from Japanese Patent Application No. 2017-010804 filed in the Japanese Patent Office on Jan. 25, 2017, the entire disclosure of which is hereby incorporated by reference in its entirely.

What is claimed is:

1. A solid-state imaging apparatus, comprising:
   a light receiving element that receives light so as to perform photoelectric conversion;
   a readout circuit that reads out charge from the light receiving element, and outputs an output voltage;
   a correlated double sampling (CDS) circuit that includes three common source circuits, and generates a pixel signal based on a difference between an output voltage output from the readout circuit at a time of reset and an output voltage output based on the readout of the pixel information, the three common source circuits being connected in series to one another and provided with direct-current cut elements that are each disposed on a corresponding one of input paths of the three common source circuits; and
   a bias voltage supply circuit that supplies a direct-current bias voltage to gates of transistors of the three common source circuits.

2. The solid-state imaging apparatus according to claim 1, wherein
   the bias voltage supply circuit supplies the direct-current bias voltage separately to the gates of the transistors of the three common source circuits so that each of gate voltages of the transistors exceeds a threshold voltage.

3. The solid-state imaging apparatus according to claim 1, wherein
   the bias voltage supply circuit supplies the direct-current bias voltage to the gate of the transistor of the common source circuit in a first stage and the gate of the transistor of the common source circuit in a second stage, in accordance with an output voltage of the readout circuit, so as to avoid overlap between a range in which a gate voltage of the transistor of the common source circuit in the first stage changes and a range in which a gate voltage of the transistor of the common source circuit in the second stage changes.

4. The solid-state imaging apparatus according to claim 1, wherein a voltage amplification factor of the common source circuit in a first stage is substantially equal to a voltage amplification factor of the common source circuit in a second stage.

5. The solid-state imaging apparatus according to claim 1, wherein
each of gate voltages of the transistors of the three common source circuits changes, in accordance with an output voltage of the readout circuit, between a voltage equal to or lower than a threshold voltage and a voltage higher than the threshold voltage.

6. The solid-state imaging apparatus according to claim 1, wherein
the direct-current cut elements include capacitors, and
in advance of the readout of the pixel information by the readout circuit, the bias voltage supply circuit supplies the direct-current bias voltage that sets operating points of the transistors of the three common source circuits.

7. The solid-state imaging apparatus according to claim 1, wherein
the direct-current cut elements include switch circuits, and
when the switch circuits are in an OFF state, the bias voltage supply circuit supplies the direct-current bias voltage that places the transistors of the three common source circuits in an OFF state.

8. An electronic device, comprising:
the solid-state imaging apparatus according to claim 1; and
a signal processor that processes a pixel signal generated by the solid-state imaging apparatus.

9. A scanner apparatus having a solid-state imaging apparatus for reading an image,
the solid-state imaging apparatus including:
a light receiving element that performs photoelectric conversion upon receiving light from the image;
a readout circuit that reads out charges from the light receiving element, and outputs an output voltage;
a correlated double sampling (CDS) circuit that generates a pixel signal based on a difference between an output voltage output from the readout circuit at a time of reset and an output voltage that is output from the readout circuit and is based on the charges read out from the light receiving element, the CDS circuit including
a common source circuit in a first stage having a first direct-current cut element connected at one end to the readout circuit, and a first transistor with a gate electrode connected to the other end of the first direct-current cut element,
a common source circuit in a second stage having a second direct-current cut element connected at one end to the common source circuit in the first stage, and a second transistor with a gate electrode connected to the other end of the second direct-current cut element, and
a common source circuit in a third stage having a third direct-current cut element connected at one end to the common source circuit in the second stage, and a third transistor with a gate electrode connected to the other end of the third direct-current cut element; and
a bias voltage supply circuit that supplies a direct-current bias voltage to a gate of the first transistor, a gate of the second transistor, and a gate of the third transistor.

* * * * *